US007063998B2

(12) United States Patent
Kim

(10) Patent No.: US 7,063,998 B2
(45) Date of Patent: Jun. 20, 2006

(54) IMAGE SENSOR HAVING PHOTO DIODE AND METHOD FOR MANUFACTURING THE SAME

(75) Inventor: Yi-tae Kim, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 156 days.

(21) Appl. No.: 10/806,489

(22) Filed: Mar. 23, 2004

(65) Prior Publication Data

US 2004/0180458 A1 Sep. 16, 2004

Related U.S. Application Data

(62) Division of application No. 10/345,852, filed on Jan. 16, 2003, now Pat. No. 6,734,471.

(30) Foreign Application Priority Data

Feb. 9, 2002 (KR) .................................... 02-7696

(51) Int. Cl.
*H01L 21/00* (2006.01)

(52) U.S. Cl. ........................................ 438/48; 257/184

(58) Field of Classification Search ................ 257/184, 257/226, 232–234, 292–293, 439, 462, 288; 438/48, 197, 309

See application file for complete search history.

(56) References Cited

U.S. PATENT DOCUMENTS

| | | | | |
|---|---|---|---|---|
| 5,191,399 | A * | 3/1993 | Maegawa et al. | 257/223 |
| 5,500,550 | A | 3/1996 | Morishita | 257/461 |
| 5,563,429 | A | 10/1996 | Isogai | 257/258 |
| 5,686,857 | A | 11/1997 | Heminger et al. | 327/451 |
| 6,610,557 | B1 * | 8/2003 | Lee et al. | 438/87 |
| 6,677,656 | B1 * | 1/2004 | François | 257/462 |

* cited by examiner

*Primary Examiner*—David Vu
(74) *Attorney, Agent, or Firm*—Mills & Onello LLP

(57) ABSTRACT

An image sensor having a photo diode with improved sensitivity, junction leakage and electron capacity, and a method for manufacturing the image sensor, are provided. The provided image sensor includes a semiconductor substrate and a p-type photo diode region formed on a selected region of the semiconductor substrate. A first n-type photo diode region is formed underneath the p-type photo diode region, contacting an interface of the p-type photo diode region, and a second n-type photo diode region is formed to surround the first n-type photo diode region. Here, impurities composing the first n-type photo diode region have smaller projection distance and diffusivity than impurities composing the second n-type photo diode region.

10 Claims, 8 Drawing Sheets

IMAGE SENSOR HAVING PHOTO DIODE AND METHOD FOR MANUFACTURING THE SAME

RELATED APPLICATIONS

This application is a divisional of U.S. application Ser. No. 10/345,852, filed on Jan. 16, 2003, now U.S. Pat. No. 6,734,471, the contents of which are incorporated herein in their entirety by reference.

BACKGROUND OF THE INVENTION

1. Field of the Invention

The present invention relates to an image sensor having a photo diode and a method for manufacturing the same, and more particularly, to an image sensor having a photo diode for improving sensibility, junction leakage, and electron capacity, and a method for manufacturing the image sensor.

2. Description of the Related Art

A pinned photo diode is used for a complementary metal-oxide semiconductor (CMOS) image sensor, which is manufactured by CMOS processes, or a charge coupled device (CCD) image sensor to detect light for generating and accumulating photo electrodes. Since the pinned photo diode is formed in a PNP or NPN junction structure buried in a substrate, the pinned photo diode is referred to as a buried photo diode. The CMOS image sensor is subject to less power consumption than the CCD image sensor and is manufactured by a simpler process. Moreover, the CMOS image sensor can be formed together with a signal processing circuit in one chip, making it attractive as a next-generation image sensor.

The CMOS image sensor having the above-described pinned photo diode will be briefly described with reference to FIGS. 1 and 2.

FIG. 1 is a circuit diagram of a unit pixel Pix in a conventional image sensor, made up of one photo diode PD and four MOS transistors. The source (or drain) of a transfer transistor Tx is connected to the photo diode PD, and the source of a reset transistor Rx is connected to the drain (or source) of the transfer transistor Tx. A floating-diffusion capacitor Cfd is formed between the drain (or source) of the transfer transistor Tx and the source of the reset transistor Rx. The gate of a drive transistor MD is connected to the source of the reset transistor Rx and the drain (or source) of a select gate Sx is connected to the source of the drive transistor MD. In this case, a source voltage $V_{DD}$ is supplied to the drains of the reset transistor Rx and the drive transistor MD. A load transistor Vb is connected to the source (or drain) of the select gate Sx outside the unit pixel Pix, and the source (or drain) of the select gate Sx operates as the output of the image sensor.

FIG. 2 illustrates a semiconductor substrate in which the unit pixel of the above-described image sensor is integrated. In FIG. 2, only the photo diode, the transfer transistor, and the reset transistor are illustrated.

As shown in FIG. 2, an isolation layer 11 is formed on the substrate 10 by a conventional method. After a gate oxide layer 12 and a conductive layer 14 are deposited on the semiconductor substrate 10, portions of the layers 12 and 14 are patterned to form a transfer gate Tg and a reset gate Rg.

P-type impurities, e.g., boron ions, are implanted into the drain region (or the source region) of the transfer transistor, which is at one side of the transfer transistor, forming a p-type photo diode region 15. Then, n-type impurities, e.g., group V impurity ions such as arsenic or phosphorus ions, are implanted into a lower portion of the p-type photo diode region 15, forming an n-type photo diode region 20. As a result, p-type and n-type photo diodes are completed. Next, spacers 22 are formed on both walls of the transfer gate Tg and the reset gate Rg by a conventional blanket etching. By implanting the n-type impurities into both sides of the spacers 22, a common source region 24 and a drain region 26 of the reset transistor are formed.

However, forming the conventional n-type photo diode region 20 by implanting a single type of impurities, such as the arsenic or phosphorus ions, causes the following problems.

When the n-type photo diode region 20 is formed by implanting arsenic ions, a depletion distance becomes smaller because the projection distance $\Delta Rp$ and diffusivity of the arsenic ions are small. Consequently, a high concentration of arsenic ions is maintained in each unit area, increasing junction capacitance. As a result, the electron capacity of the photo diode is improved. However, since the projection distance $\Delta Rp$ and diffusivity of the arsenic ions are small, it is difficult to form the n-type photo diode region 20 over a large area. Accordingly, the sensitivity of the photo diode is reduced, and it is likely that junction leakage occurs with an abrupt junction profile.

When the n-type photo diode 20 is formed by implanting phosphorus ions, the photo diode is easily formed over a large area, due to a large projection distance $\Delta Rp$ and diffusivity, improving sensitivity. In addition, the junction leakage is reduced by smoothing the profile on a junction interface. However, since the projection distance $\Delta Rp$ and diffusivity of the phosphorus ions are large, the depletion distance is increased, thereby reducing the junction capacitance and the concentration of phosphorus ions in each unit area. As a result, the electron capacity of the photo diode is reduced.

SUMMARY OF THE INVENTION

To solve the above-described problems, it is an objective of the present invention to provide an image sensor having a photo diode with improved sensitivity, junction leakage and electron capacity.

It is another objective of the present invention to provide a method for manufacturing the image sensor having the photo diode.

In one aspect, the present invention is directed to an image sensor having a photo diode. The image sensor includes a semiconductor substrate and a p-type photo diode region formed on a selected region of the semiconductor substrate. A first n-type photo diode region is formed underneath the p-type photo diode region, contacting an interface of the p-type photo diode region, and a second n-type photo diode region is formed to surround the first n-type photo diode region. In accordance with the invention, impurities of the first n-type photo diode region have smaller projection distance and diffusivity than impurities of the second n-type photo diode region.

The impurities of the first n-type photo diode region may be arsenic ions, the impurities of the second n-type photo diode region may be phosphorus ions, and the impurities of the p-type photo diode region may be boron ions.

It is preferable that the second n-type photo diode region be formed over a larger area than the first n-type photo diode region.

An image sensor having a semiconductor substrate according to a second embodiment of the present invention comprises a transfer gate and reset gate formed on predetermined portions of the semiconductor substrate with a specific distance therebetween. A photo diode region is formed on one side of the transfer gate, a common source region is formed between the transfer gate and the reset gate, and a drain region of the reset transistor is formed on the other side of the reset gate. In accordance with the invention, the photo diode region includes a p-type photo diode region formed on the surface of the photo diode region of the semiconductor substrate, a first n-type photo diode region underneath the p-type photo diode region, contacting an interface of the p-type photo diode region, and a second n-type photo diode region surrounding the first n-type photo diode region. It is preferable that impurities of the first n-type photo diode region have smaller projection distance and diffusivity than impurities of the second n-type photo diode region.

In accordance with another aspect, the invention is directed to a method for manufacturing an image sensor having a photo diode. In accordance with the method, a transfer gate and a reset gate are formed on predetermined portions of a semiconductor substrate with a specific distance therebetween. A photoresist pattern is formed to expose a region at one side of the transfer gate. A p-type photo diode region is formed by implanting p-type impurities into the exposed semiconductor substrate with a first ion implantation energy. A first n-type photo diode region is formed by implanting first n-type impurities into a portion below the p-type photo diode region, with a second ion implantation energy. A second n-type photo diode region is formed by implanting second n-type impurities into a portion surrounding the first n-type photo diode region, with a third ion implantation energy. The photoresist pattern is removed.

In one embodiment, the p-type impurities are boron ions. The first n-type impurities may be arsenic ions. The arsenic ions can be implanted with a concentration of $1\times10^{12}/cm^2$ to $9\times10^{12}/cm^2$, and the second ion implantation energy is greater than the first ion implantation energy.

The second n-type impurities may be phosphorus ions. The phosphorus ions can be implanted with a concentration of $5\times10^{11}/cm^2$ to $9\times10^{11}/cm^2$, and the third ion implantation energy is greater than each of the first and second ion implantation energies.

The steps of forming the p-type photo diode region, forming the first n-type photo diode region, and forming the second n-type photo diode region can be performed in different temporal orders.

In addition, after removing the photoresist pattern, spacers can be formed on both walls of the transfer gate and the reset gate, and a junction region can be formed by implanting the n-type impurities into a space between the transfer gate and reset gate, and to one side of the reset gate.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
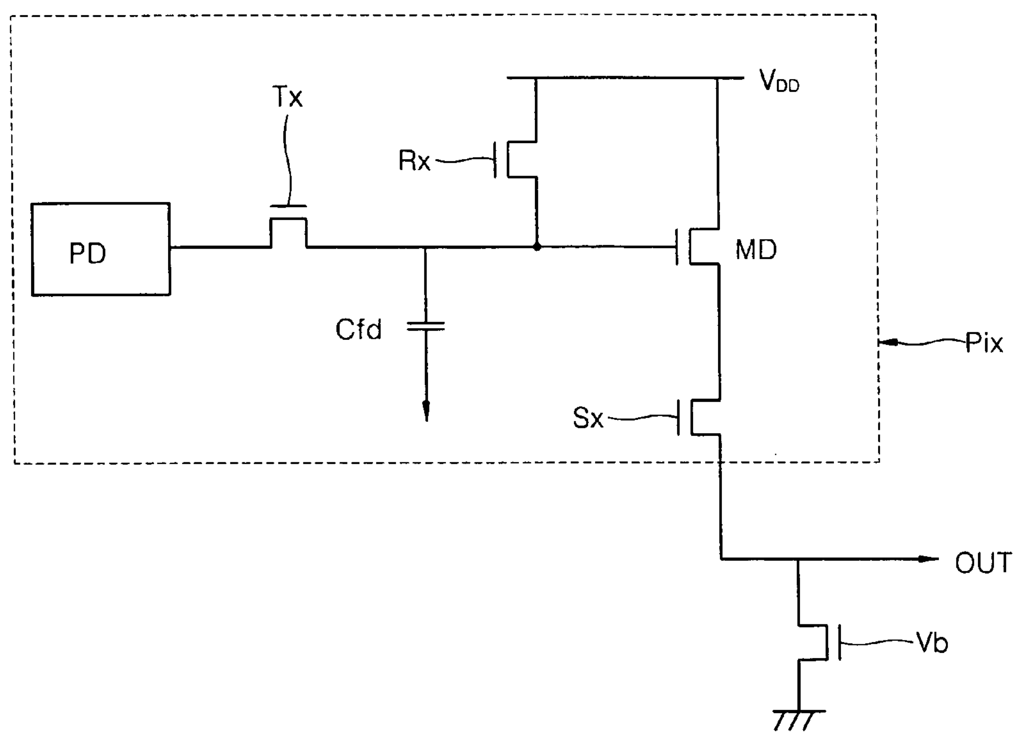
FIG. 1 is a circuit diagram illustrating a unit pixel of a conventional image sensor.
Figure 2:
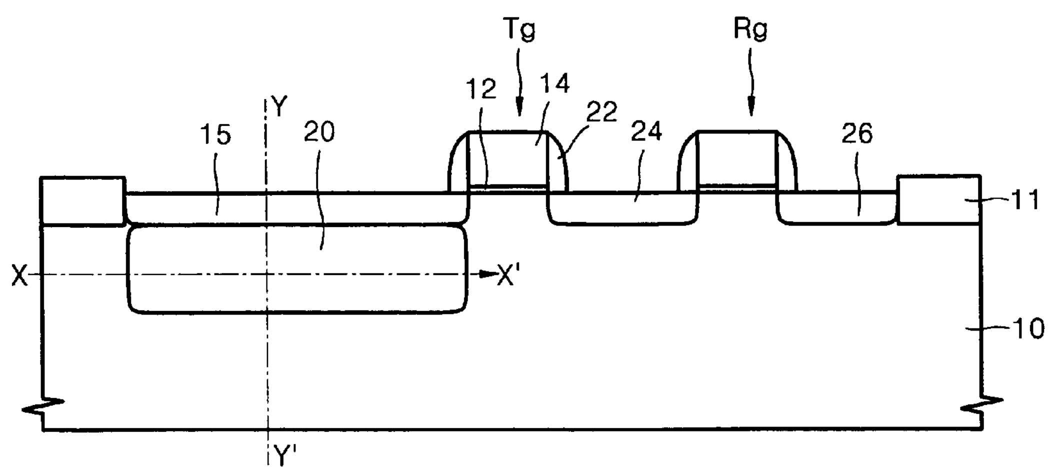
FIG. 2 is a sectional view of an image sensor having a conventional photo diode.

The present invention now will be described more fully with reference to the accompanying drawings, in which preferred embodiments of the invention are shown. In the drawings, the thickness of layers and regions are exaggerated for clarity. It will also be understood that when a layer is referred to as being "on" another layer or substrate, it can be directly on the other layer or substrate, or intervening layers may also be present.

FIGS. 3A through 3E are sectional views of stages in the manufacture of an image sensor having a photo diode according to an embodiment of the present invention. The drawings illustrate only a transfer transistor, a reset transistor, and photo diode regions of the image sensor.

Figure 3A:
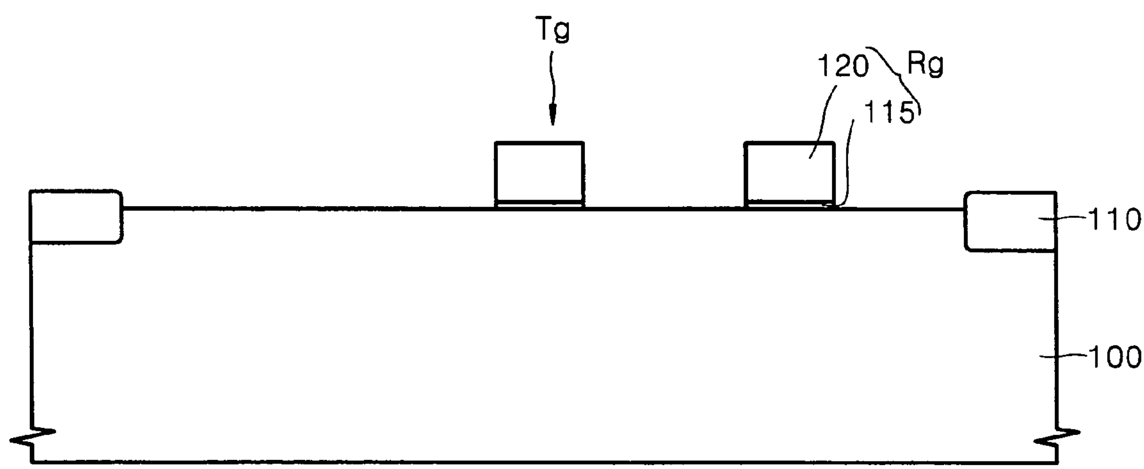
FIGS. 3A through 3E are sectional views of stages in the manufacture of an image sensor having a photo diode according to an embodiment of the present invention.

Referring to FIG. 3A, an isolation layer 110 is formed on a semiconductor substrate 100, for example a p-type silicon substrate, by a conventional method. The isolation layer 110 can be formed by a shallow trench isolation (STI) method or a local oxidation of silicon (LOCOS) method. A gate oxide layer 115 and a conductive layer, e.g., a doped polysilicon layer 120, are successively stacked on the semiconductor substrate 100 on which an active region is defined by the isolation layer 110. Then, predetermined portions of the doped polysilicon layer 120 and the gate oxide layer 115 are patterned to form a transfer gate Tg and a reset gate Rg.

Figure 3B:
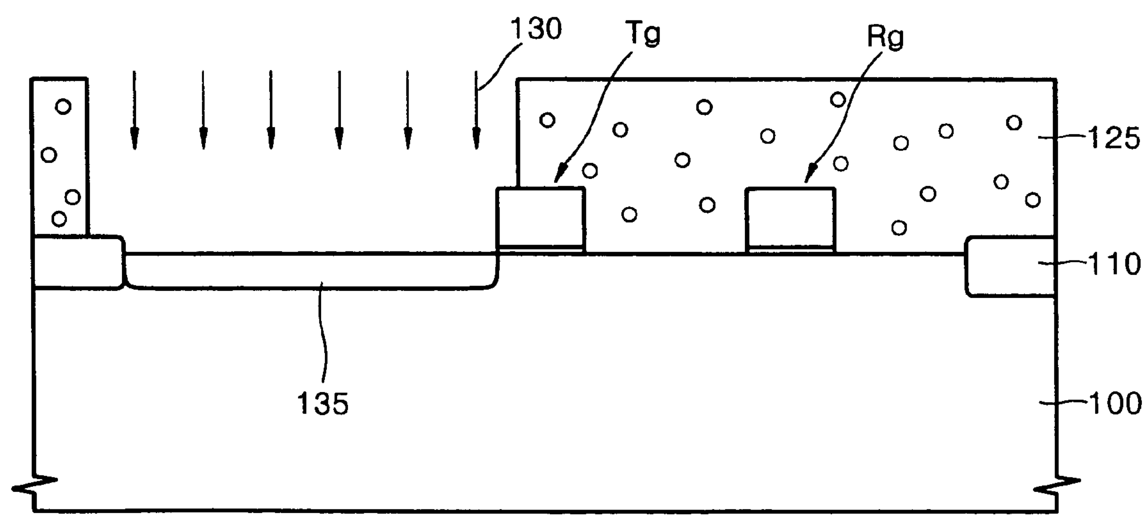

Referring to FIG. 3B, a photoresist pattern 125 is formed by a conventional photolithography method, so that one side of the transfer gate Tg, e.g., a drain region, is exposed. In this case, the exposed region will become the photo diode region. P-type impurities, for example boron ions 130, are implanted into the exposed photo diode region with a first ion implantation energy. In this case, it is preferable that the first ion implantation energy is low, in order to locate the boron ions on the surface of the semiconductor substrate 100. The boron ions implanted into the semiconductor substrate 100 are activated to form a boron photo diode region 135.

Figure 3C:
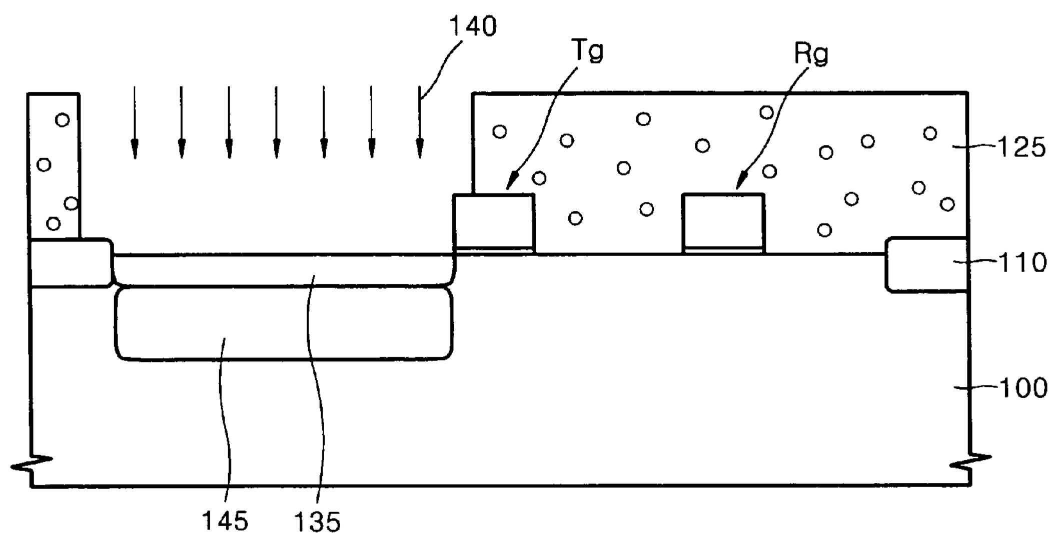

Referring to FIG. 3C, first n-type impurities are implanted into the exposed photo diode region, with a second ion implantation energy. In this case, the first n-type impurities are arsenic ions 140 having small projection distance $\Delta Rp$ and diffusivity, and a concentration of $1\times10^{12}/cm^2$ to $9\times10^{12}/cm^2$. The second ion implantation energy is greater than the first ion implantation energy, so that the arsenic ions 140 are located underneath the boron photo diode region 135. It is preferable that the arsenic ions 140 are implanted to a projection distance of about 0.5 μm from the surface of the semiconductor substrate 100. The arsenic ions 140 implanted below the boron photo diode region 135 are activated to form an arsenic photo diode region 145. In this case, since the projection distance ΔRp and diffusivity of the arsenic ions are small, the arsenic photo diode region 145 occupies a relatively small area while meeting the boundary of the boron photo diode region 135.

Figure 3D:
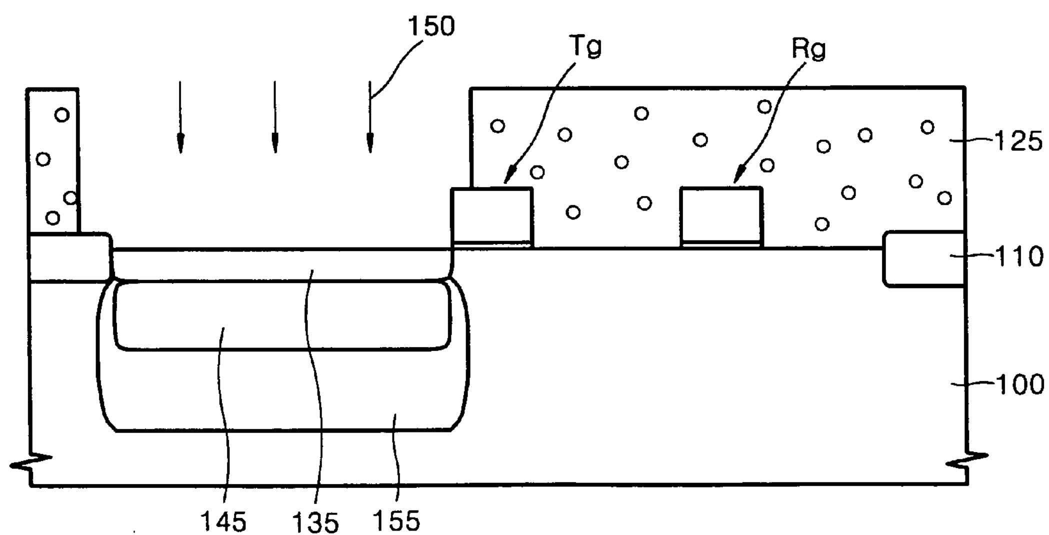

Referring to FIG. 3D, second n-type impurities, for example phosphorus ions 150, are implanted into the exposed boron and arsenic photo diode regions 135 and 145 with a third ion implantation energy. In this case, the concentration of the phosphorus ions 150 is about $5\times10^{11}/cm^2$ to $9\times10^{11}/cm^2$. The third ion implantation energy is the greatest out of the first through third ion implantation energies, so that the phosphorus ions 150 surround the bottom and sides of the arsenic photo diode region 145. It is preferable that phosphorus ions 150 are implanted to a projection distance of about 1 to 1.5 μm from the surface of the semiconductor substrate 100. The phosphorus ions 150 implanted below the arsenic photo diode region 145 are activated to form a phosphorus photo diode region 155. In this case, since the projection distance ΔRp and diffusivity of the phosphorus ions are greater than those of the arsenic ions, the phosphorus photo diode region 155 occupies a relatively large area surrounding the arsenic photo diode region 145.

Figure 3E:
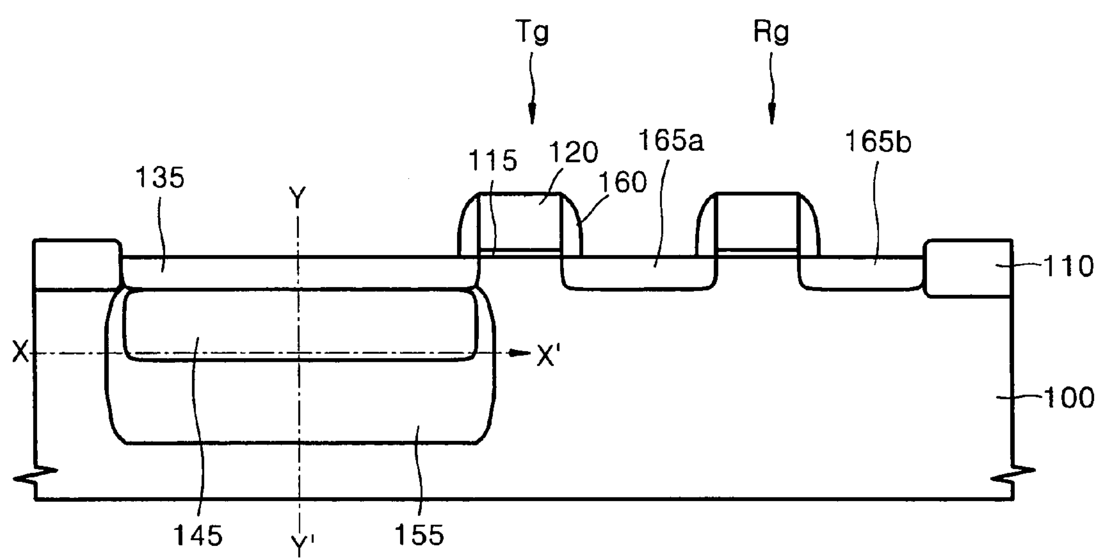

Referring to FIG. 3E, the photoresist pattern 125 is removed by a plasma ashing method. Then, spacers 160 are formed on both walls of the transfer gate Tg and the reset gate Rg by a conventional blanket etching. The n-type impurities are implanted into the semiconductor substrate 100 on both sides of the gates Tg and Rg but not in the photo diode regions 135, 145, and 155. Thus, a common source region 165*a* of the transfer and reset transistors Tg and Rg, and a drain region 165*b* of the reset transistor Rg, are formed. This completes the image sensor having the photo diode.

Figure 4A:
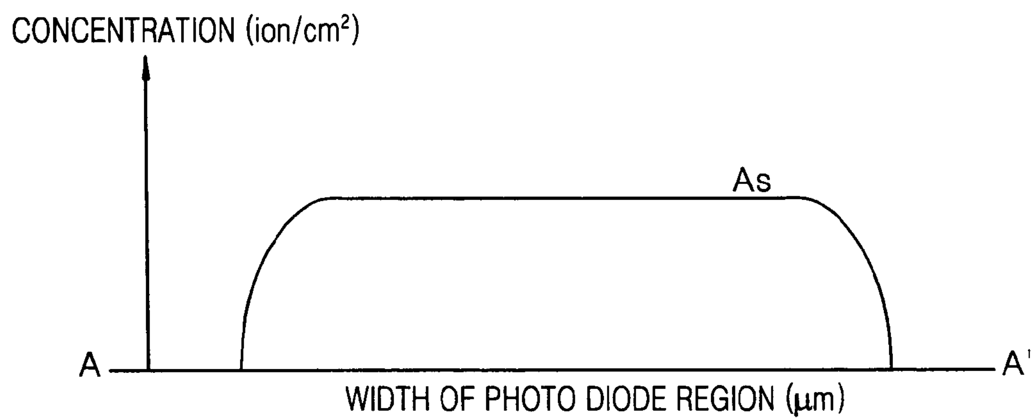
FIG. 4A is a graph illustrating the doping profile of a conventional n-type photo diode region, namely an arsenic or phosphorus photo diode region, in a traverse direction.
Figure 4B:
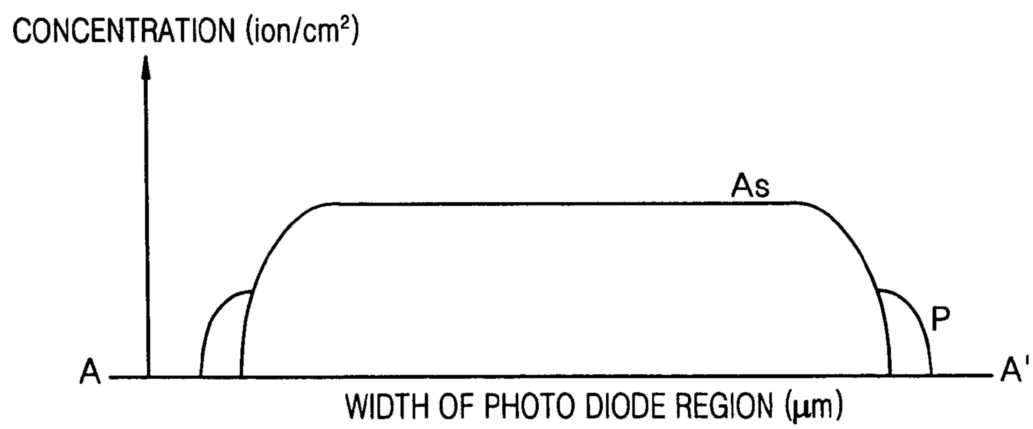
FIG. 4B is a graph illustrating the doping profile of n-type photo diode regions according to the present invention, namely arsenic and phosphorus photo diode regions, in a traverse direction.

FIG. 4A illustrates the doping profile of a conventional n-type photo diode region, e.g., an arsenic or phosphorus photo diode region, in a traverse direction X–X', and FIG. 4B illustrates the doping profile of the n-type photo diode regions according to the present invention, i.e., the arsenic and phosphorus photo diode regions, in a traverse direction X–X'. Referring to FIG. 4A, since only one of either arsenic ions or phosphorus ions is implanted, a junction interface forms a sudden or abrupt inclination. Meanwhile, when both arsenic ions and phosphorus ions are successively implanted as shown in FIG. 4B, the doping profile at the junction interface is formed with a gradual staircase shape because the concentration of the arsenic ions is greater than that of the phosphorus ions.

Figure 5A:
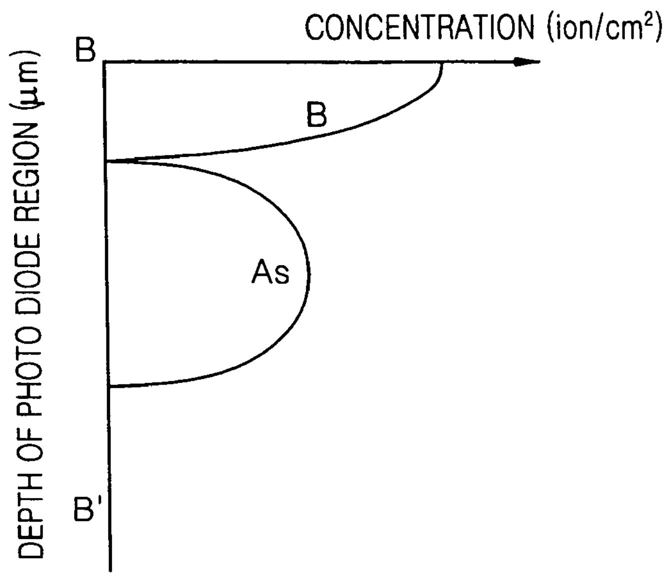
FIG. 5A is a graph illustrating the doping profile of the conventional n-type photo diode region, namely the arsenic or phosphorus photo diode region, in a longitudinal direction.
Figure 5B:
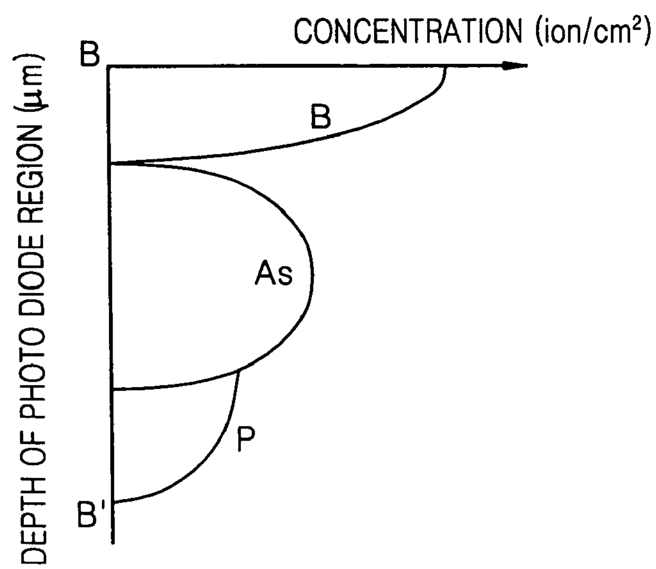
FIG. 5B is a graph illustrating the doping profile of the n-type photo diode regions according to the present invention, namely the arsenic and phosphorus photo diode regions, in a longitudinal direction.

FIG. 5A illustrates the doping profile of the conventional n-type photo diode region, e.g., the arsenic or phosphorus photo diode region, in a longitudinal direction Y–Y', and FIG. 5B illustrates the doping profile of the n-type photo diode regions according to the present invention, i.e., the arsenic and phosphorus photo diode regions, in a longitudinal direction Y–Y'. Referring to FIG. 5A, since only the arsenic photo diode region exists under the boron photo diode region, and the diffusivity of the arsenic ions is small, the arsenic ion region occupies a small area. Referring to FIG. 5B, when both the arsenic and phosphorus ions are implanted, the phosphorus ions are widely diffused underneath the arsenic ions because the diffusivity of the phosphorus ions is greater than that of the arsenic ions.

As is widely known, the junction capacitance is represented by the following formula.

$$C \propto N_d \tag{1}$$

Here, C represents the junction capacitance, and $N_d$ represents the concentration of a junction region, namely the arsenic photo diode region.

As shown in the above formula, the junction capacitance is proportional to the concentration of the photo diode region. Accordingly, when the arsenic photo diode region, with its small depletion length and high concentration, is arranged underneath the boron diode region, the junction capacitance is improved.

In addition, when the phosphorus ions having the great projection distance ΔRp and diffusivity are implanted below the arsenic photo diode region, the phosphorus photo diode region is formed over a relatively large area, surrounding the arsenic photo diode region. Therefore, the sensitivity of the photo diode is improved, and the doping profile at the junction interface is more gradual, thereby reducing the junction leakage.

Figure 6A:
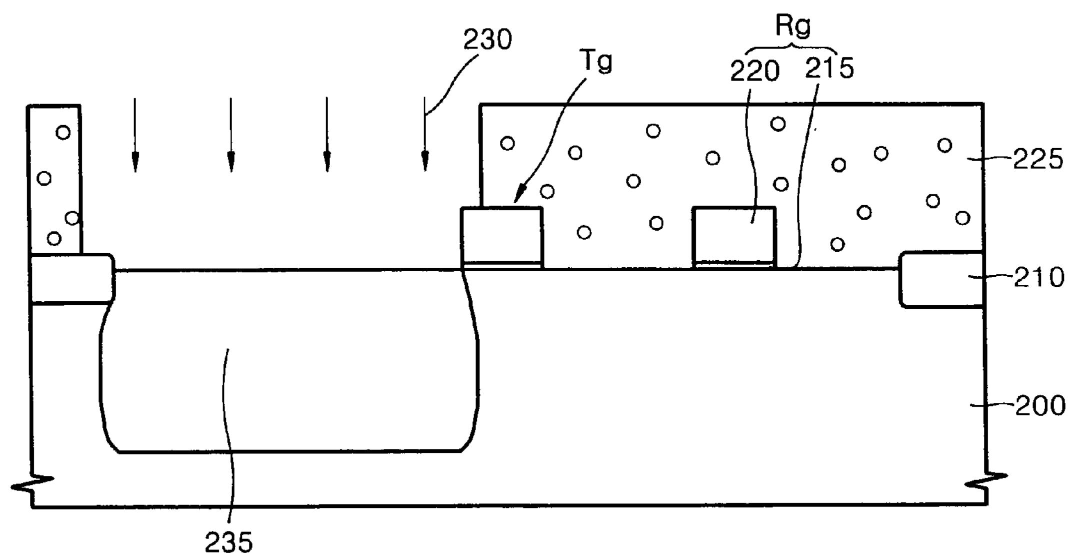
FIGS. 6A through 6C are sectional views of stages in the manufacture of an image sensor having a photo diode according to a second embodiment of the present invention.
Figure 6B:
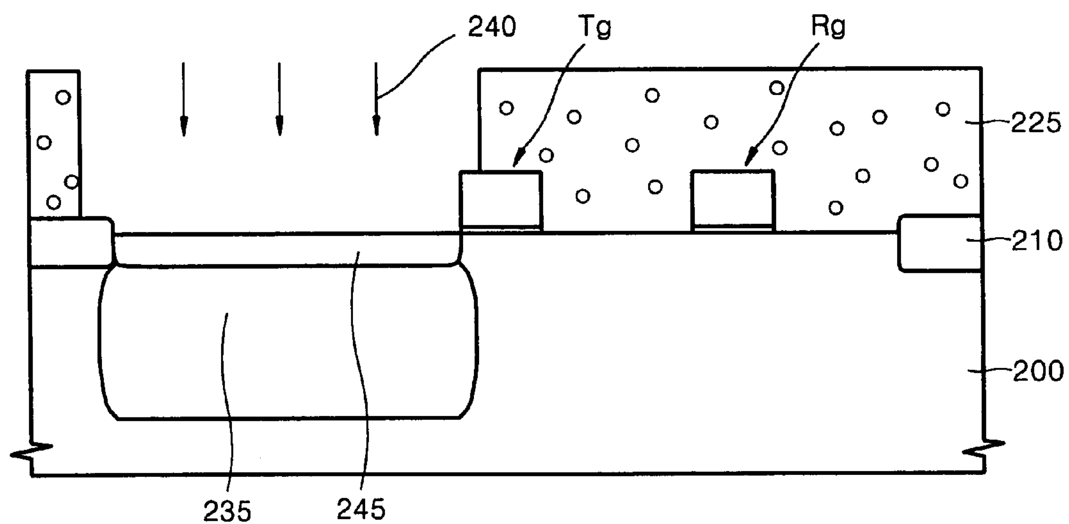
Figure 6C:
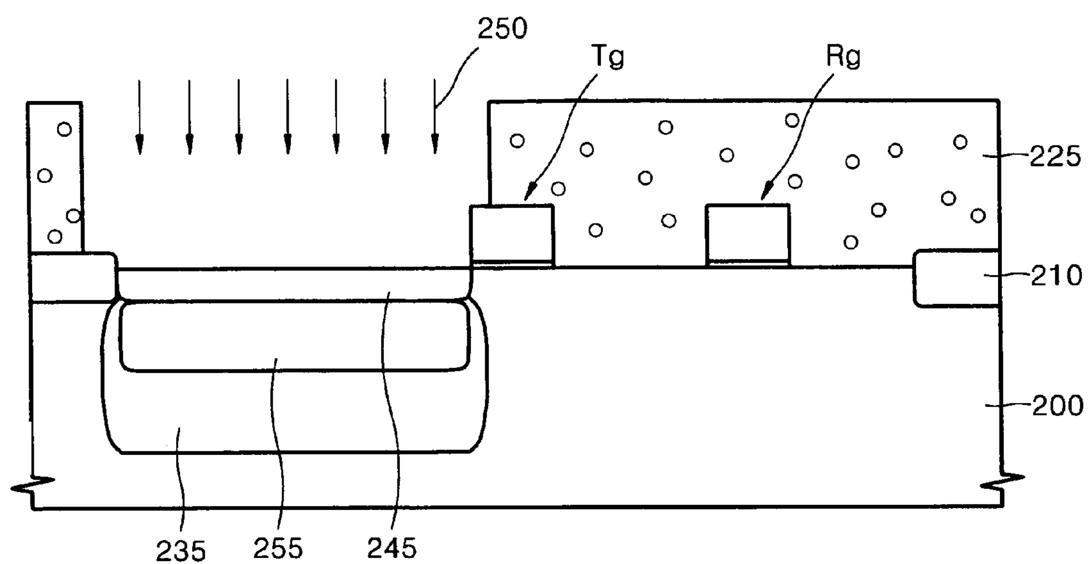

FIGS. 6A through 6C are sectional views of stages in the manufacture of an image sensor having a photo diode according to a second embodiment of the present invention.

Referring to FIG. 6A, an isolation layer 210 is formed on a p-type silicon substrate, for example a semiconductor substrate 200. A gate oxide layer 215 and a conductive layer, e.g., a doped polysilicon layer 220, are successively stacked on the semiconductor substrate 200 on which an active region is defined by the isolation layer 210. Then, portions of the doped polysilicon layer 220 and gate oxide layer 215 are patterned to form a transfer gate Tg and a reset gate Rg. A photoresist pattern 225 is formed by a conventional photolithography method, to expose one side of the transfer gate Tg, ie.g., a drain region, which will become a photo diode. First n-type impurities having great projection distance and diffusivity, for example phosphorus ions 230, are implanted into the exposed photo diode region. In this case, the phosphorus ions 230 are implanted with a first ion implantation energy, which is relatively large, so that the phosphorus ions 230 are widely and deeply implanted into the photo diode region of the semiconductor substrate 200. Then, the phosphorus ions 230 are activated to form a phosphorus photo diode region 235.

Referring to FIG. 6B, p-type impurities, i.e. boron ions 240, are implanted into the surface of the phosphorus photo diode region 235 which is exposed by the photoresist pattern 225, with a second ion implantation energy. In this case, the second ion implantation energy is smaller than the first ion implantation energy. By activating the boron ions 240 implanted into the substrate 200, a boron photo diode region 245 is formed.

Referring to FIG. 6C, second n-type impurities having smaller projection distance and diffusivity than the phosphorus ions, for example arsenic ions 250, are implanted into the lower portion of the exposed boron photo diode region 245, with a third ion implantation energy. In this case, since the third ion implantation energy is smaller than the first ion implantation energy and greater than the second ion implantation energy, the arsenic ions 250 are located in the phosphorus photo diode region 235 underneath the boron photo diode region 245. The implanted arsenic ions are activated to form an arsenic photo diode region 255. Then, the photoresist pattern 225 is removed by a conventional method as shown in FIG. 3E to form a transistor.

In the preferred embodiment, the boron and arsenic photo diode regions are formed after forming the phosphorus photo diode region; however, the processing order of the photo diode regions can be altered without affecting the efficiency of the photo diode according to the first embodiment.

As described above, according to the present invention, the arsenic photo diode region is formed underneath the boron photo diode region, and the phosphorus photo diode region is formed surrounding the arsenic photo diode region.

Consequently, the junction capacitance is greatly increased at the junction interface between the boron and arsenic photo diode regions, thereby improving the electron capacity of the photo diode.

Moreover, since the phosphorus photo diode region surrounds the arsenic photo diode region, the doping profile at the junction interface is more gradual, reducing junction leakage. In addition, the phosphorus photo diode region occupies a large area, improving sensitivity.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing an image sensor having a photo diode, comprising:

- forming a transfer gate and a reset gate on predetermined portions of a semiconductor substrate with a specific distance therebetween;
- forming a photoresist pattern for exposing a region at one side of the transfer gate;
- forming a p-type photo diode region by implanting p-type impurities into the exposed semiconductor substrate with a first ion implantation energy;
- forming a first n-type photo diode region by implanting first n-type impurities into a portion below the p-type photo diode region, with a second ion implantation energy;
- forming a second n-type photo diode region by implanting second n-type impurities having greater projection distance and diffusivity than the first n-type impurities into a portion surrounding the first n-type photo diode region, with a third ion implantation energy; and
- removing the photoresist pattern.

2. The method for manufacturing the image sensor having the photo diode of claim 1, wherein the p-type impurities are boron ions.

3. The method for manufacturing the image sensor having the photo diode of claim 1, wherein the first n-type impurities are arsenic ions.

4. The method for manufacturing the image sensor having the photo diode of claim 3, wherein the arsenic ions are implanted into with a concentration of $1\times10^{12}/cm^2$ to $9\times10^{2}/cm^2$.

5. The method for manufacturing the image sensor having the photo diode of claim 1, wherein the second ion implantation energy is greater than the first ion implantation energy.

6. The method for manufacturing the image sensor having the photo diode of claim 1, wherein the second n-type impurities are phosphorus ions.

7. The method for manufacturing the image sensor having the photo diode of claim 6, wherein the phosphorus ions are implanted into with a concentration of $5\times10^{11}/cm^2$ to $9\times10^{11}/cm^2$.

8. The method for manufacturing the image sensor having the photo diode of claim 1, wherein the third ion implantation energy is greater than each of the first and second ion implantation energies.

9. The method for manufacturing the image sensor having the photo diode of claim 1, wherein the order of the steps of:

- forming the p-type photo diode region;
- forming the first n-type photo diode region; and
- forming the second n-type photo diode region is altered.

10. The method for manufacturing the image sensor having the photo diode of claim 1, further comprising:

- forming spacers on both walls of the transfer gate and the reset gate; and
- forming a junction region by implanting the n-type impurities into a space between the transfer gate and reset gate, and to one side of the reset gate, after removing the photoresist pattern.

* * * * *